(12) United States Patent
Sawada et al.

(10) Patent No.: US 11,881,878 B2
(45) Date of Patent: Jan. 23, 2024

(54) RADIO FREQUENCY MODULE AND COMMUNICATION DEVICE

(71) Applicant: Murata Manufacturing Co., Ltd., Nagaokakyo (JP)

(72) Inventors: Yoichi Sawada, Nagaokakyo (JP); Takayuki Shinozaki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/165,951

(22) Filed: Feb. 8, 2023

(65) Prior Publication Data

US 2023/0188169 A1     Jun. 15, 2023

Related U.S. Application Data

(63) Continuation of application No. 17/727,806, filed on Apr. 25, 2022, now Pat. No. 11,606,108, which is a continuation of application No. 17/187,889, filed on Mar. 1, 2021, now Pat. No. 11,349,511.

(30) Foreign Application Priority Data

Mar. 13, 2020   (JP) ................................. 2020-044185

(51) Int. Cl.
*H04B 1/04*   (2006.01)

(52) U.S. Cl.
CPC ....... *H04B 1/04* (2013.01); *H04B 2001/0416* (2013.01)

(58) Field of Classification Search
CPC ......... H01L 21/84; H01L 23/60; H01L 24/16; H01L 25/16; H03C 1/62; H03F 1/56; H03F 3/19; H03F 3/21; H03F 3/24; H03F 3/195; H03F 2200/267; H03F 2200/294; H03F 2200/451; H04B 1/00; H04B 1/04; H04B 1/16; H04B 1/28; H04B 1/38; H04B 1/44; H04B 1/48; H04B 1/0053; H04B 1/0057; H04B 1/0475; H04B 17/00; H04B 200/0408; H04B 2001/0416; H04M 1/02; H04M 1/0277
USPC ......... 333/129, 132, 133; 375/262, 295–297, 375/328; 455/82, 115.1, 127.1, 323, 333, 455/522

See application file for complete search history.

(56) References Cited

U.S. PATENT DOCUMENTS

| 8,766,723 | B1  |    | 7/2014  | Loeb et al. |            |
|-----------|-----|----|---------|-------------|------------|
| 9,093,967 | B2  | *  | 7/2015  | Gorbachov   | H03F 3/68  |
| 10,826,543| B2  | *  | 11/2020 | Ella        | H04L 5/001 |
| 11,349,511| B2  | *  | 5/2022  | Sawada      | H04B 1/03  |
| 11,606,108| B2  | *  | 3/2023  | Sawada      | H01L 23/49811 |

(Continued)

FOREIGN PATENT DOCUMENTS

| JP | 2018-137522 A | 8/2018 |
| JP | 2020-027975 A | 2/2020 |

*Primary Examiner* — Shawkat M Ali
(74) *Attorney, Agent, or Firm* — XSENSUS LLP

(57) ABSTRACT

A radio frequency module includes: a module board that includes a first principal surface and a second principal surface on opposite sides of the module board; a power amplifier configured to amplify a transmission signal; a first circuit component; and a power amplifier (PA) control circuit configured to control the power amplifier. The power amplifier and the PA control circuit are stacked on the first principal surface, and the first circuit component is disposed on the second principal surface.

22 Claims, 8 Drawing Sheets

(56) References Cited

U.S. PATENT DOCUMENTS

| | | |
|---|---|---|
| 2005/0245212 A1 | 11/2005 | Ono et al. |
| 2012/0009886 A1* | 1/2012 | Poulin .................... H04B 1/005 |
| | | 455/78 |
| 2015/0303971 A1 | 10/2015 | Reisner et al. |
| 2018/0096951 A1 | 4/2018 | Chen et al. |
| 2018/0226924 A1 | 8/2018 | Ngai et al. |
| 2018/0261566 A1 | 9/2018 | Babcock et al. |
| 2019/0268046 A1 | 8/2019 | Kim et al. |
| 2020/0169285 A1 | 5/2020 | Arfaei Malekzadeh et al. |

* cited by examiner

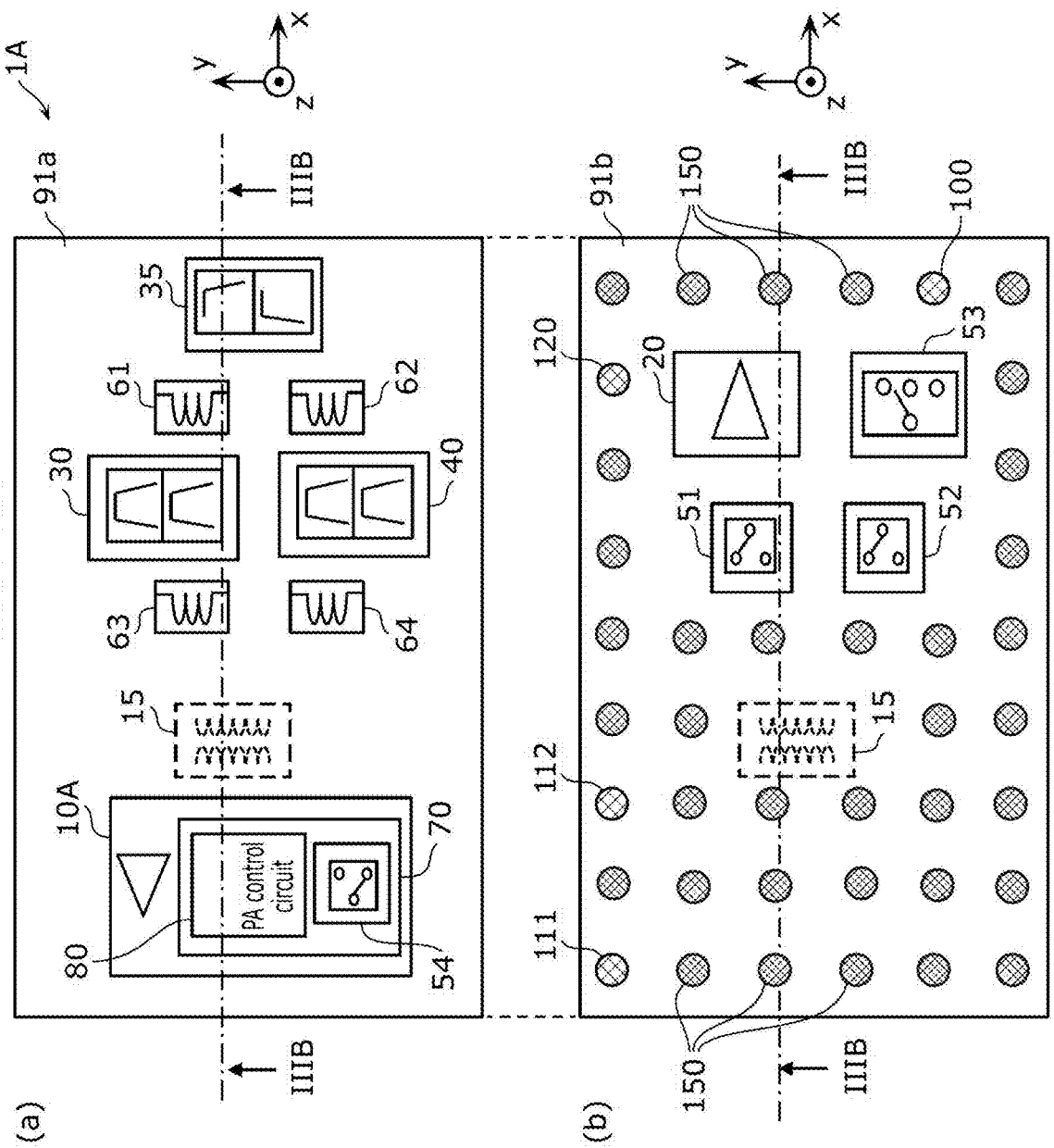

RADIO FREQUENCY MODULE AND COMMUNICATION DEVICE

CROSS-REFERENCE TO RELATED APPLICATIONS

The present application is a continuation of U.S. application Ser. No. 17/727,806, filed Apr. 25, 2022, which is a continuation of U.S. application Ser. No. 17/187,889, filed Mar. 1, 2021 (now U.S. Pat. No. 11,349,511), which is based on and claims priority of Japanese Patent Application No. 2020-044185, filed Mar. 13, 2020. The entire disclosure of the above-identified applications, including the specification, drawings and claims are incorporated herein by reference in its entirety.

TECHNICAL FIELD

The present disclosure relates to a radio frequency module and a communication device.

BACKGROUND

A power amplifier that amplifies radio frequency transmission signals is provided in a mobile communication apparatus such as a mobile phone. Japanese Unexamined Patent Application Publication No. 2018-137522 discloses a front end circuit (a radio frequency (RF) module) that includes a power amplifier (PA) circuit (a transmission amplifier circuit) that transfers a transmission signal, and a low noise amplifier (LNA) circuit (a reception amplifier circuit) that transfers a reception signal. A PA controller that controls amplification characteristics of a power amplifier is disposed in the transmission amplifier circuit, and an LNA controller that controls amplification characteristics of a low noise amplifier is disposed in the reception amplifier circuit.

SUMMARY

Technical Problems

However, as recognized by the present inventor, the RF module disclosed in Japanese Unexamined Patent Application Publication No. 2018-137522 has a problem that heat generated by the power amplifier that outputs a high-power transmission signal locally increases the temperature in the transmission amplifier circuit, and causes variations in the temperature between the power amplifier and the PA controller, thus deteriorating output characteristics of the power amplifier.

The present disclosure has been conceived in order to solve the above-identified and other problems, and provides a radio frequency module and a communication device that reduce deterioration in output characteristics of power amplifiers.

Solutions

In order to provide such a radio frequency module, a radio frequency module according to an aspect of the present disclosure includes: a module board that includes a first principal surface and a second principal surface on opposite sides of the module board; a power amplifier configured to amplify a transmission signal; a first circuit component; and a control circuit configured to control the power amplifier. The power amplifier and the control circuit are stacked on the first principal surface, and the first circuit component is disposed on the second principal surface.

Advantageous Effects

According to the present disclosure, a radio frequency module and a communication device that reduce deterioration in output characteristics of power amplifiers are provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3A is a schematic diagram illustrating a planar configuration of a radio frequency module according to Example 1.

DESCRIPTION OF EMBODIMENTS

Figure 1:
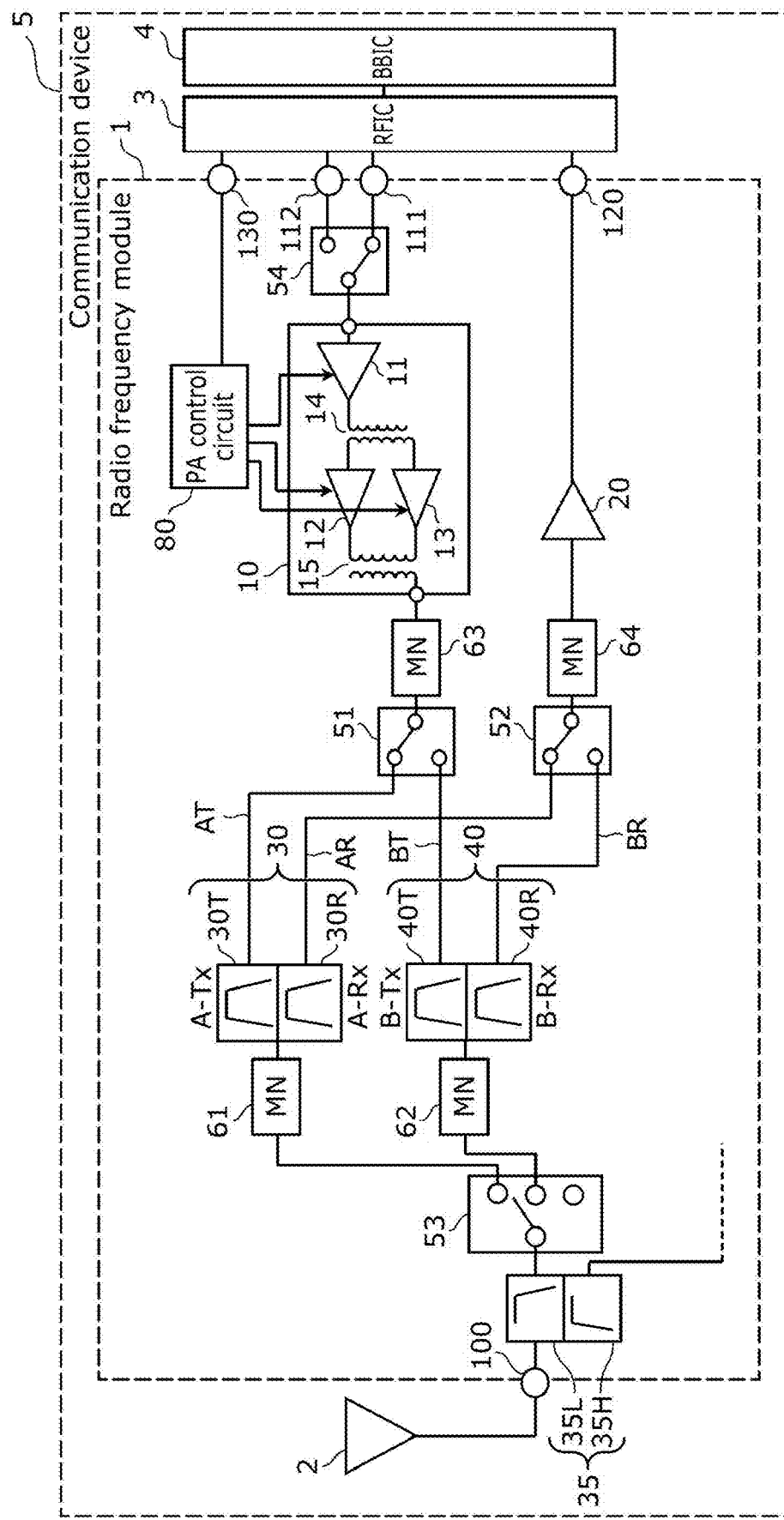
FIG. 1 illustrates a circuit configuration of a radio frequency module and a communication device according to an embodiment.

The following describes in detail embodiments of the present disclosure. Note that the embodiments described below each show a general or specific example. The numerical values, shapes, materials, elements, and the arrangement and connection of the elements, for instance, described in the following embodiments are examples, and thus are not intended to limit the present disclosure. Among the elements in the following examples and variations, elements not recited in any of the independent claims are described as arbitrary elements. In addition, the sizes of elements and the ratios of the sizes illustrated in the drawings are not necessarily accurate. Throughout the drawings, the same numeral is given to substantially the same element, and redundant description may be omitted or simplified.

In the following, a term that indicates a relation between elements such as "parallel" or "perpendicular", a term that indicates the shape of an element such as "rectangular", and a numerical range do not necessarily have only strict meanings, and also cover substantially equivalent ranges that include a difference of about several percent, for example.

In the following, regarding A, B, and C mounted on a board, "C is disposed between A and B in a plan view of a board (or a principal surface of a board)" means at least one of line segments that connect arbitrary points in A and B passes through a region of C in a plan view of a board. A plan view of a board means that a board and a circuit element mounted on the board are viewed, being orthogonally projected onto a plane parallel to a principal surface of the board. In addition, "on" in expressions such as mounted on, disposed on, provided on, stacked on, and formed on, for example, does not necessarily indicate direct contact.

In the following, a "transmission path" means a transfer route that includes, for instance, a line through which a radio frequency transmission signal propagates, an electrode directly connected to the line, and a terminal directly connected to the line or the electrode. Further, a "reception path" means a transfer route that includes, for instance, a line through which a radio frequency reception signal propagates, an electrode directly connected to the line, and a terminal directly connected to the line or the electrode. In addition, a "transmission and reception path" means a transfer route that includes, for instance, a line through which a radio frequency transmission signal and a radio frequency reception signal propagate, an electrode directly connected to the line, and a terminal directly connected to the line or the electrode.

In the following, "A and B are connected" applies not only when A and B are physically connected, but also when A and B are electrically connected.

Embodiment

[1. Circuit Configuration of Radio Frequency Module 1 and Communication Device 5]

FIG. 1 illustrates a circuit configuration of radio frequency module 1 and communication device 5 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4.

RFIC 3 is an RF signal processing circuit that processes radio frequency signals transmitted and received by antenna 2. Specifically, RFIC 3 processes a reception signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a transmission signal generated by being processed to a transmission path of radio frequency module 1.

BBIC 4 is a circuit that processes signals using an intermediate frequency band lower than the frequency range of a radio frequency signal transferred in radio frequency module 1. A signal processed by BBIC 4 is used, for example, as an image signal for image display or as an audio signal for talk through a loudspeaker.

RFIC 3 also functions as a controller that controls connection made by switches 51, 52, 53, and 54 included in radio frequency module 1, based on a communication band (a frequency band) to be used. Specifically, RFIC 3 changes connection made by switches 51 to 54 included in radio frequency module 1 according to control signals (not illustrated). Specifically, RFIC 3 outputs digital control signals for controlling switches 51 to 54 to power amplifier (PA) control circuit 80. PA control circuit 80 of radio frequency module 1 controls connection and disconnection of switches 51 to 54 by outputting digital control signals to switches 51 to 54 according to the digital control signals input from RFIC 3.

RFIC 3 also functions as a controller that controls gains of amplifying elements 11 to 13 of transmission amplifier circuit 10 included in radio frequency module 1 and power supply voltage Vcc and bias voltage Vbias that are supplied to amplifying elements 11 to 13. Specifically, RFIC 3 outputs digital control signals to control signal terminal 130 of radio frequency module 1. PA control circuit 80 of radio frequency module 1 adjusts gains of amplifying elements 11 to 13 by outputting control signals, power supply voltage Vcc, or bias voltage Vbias to amplifying elements 11 to 13 according to digital control signals input through control signal terminal 130. Note that a control signal terminal that receives, from RFIC 3, digital control signals for controlling gains of amplifying elements 11 to 13 and a control signal terminal that receives, from RFIC 3, digital control signals for controlling power supply voltage Vcc and bias voltage Vbias that are supplied to amplifying elements 11 to 13 may be different terminals. The controller may be disposed outside of RFIC 3, and may be disposed in BBIC 4, for example.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes antenna connection terminal 100, transmission amplifier circuit 10, low noise amplifier 20, transmission filters 30T and 40T, reception filters 30R and 40R, PA control circuit 80, matching circuits 61, 62, 63, and 64, switches 51, 52, 53, and 54, and diplexer 35.

Antenna connection terminal 100 is an example of an input/output terminal, and is an antenna common terminal connected to antenna 2.

Transmission amplifier circuit 10 is a difference amplifying type amplifier circuit that amplifies transmission signals in communication bands A and B input through transmission input terminals 111 and 112.

PA control circuit 80 adjusts gains of amplifying elements 11 to 13 included in transmission amplifier circuit 10 according to, for instance, digital control signals input through control signal terminal 130. PA control circuit 80 may be formed as a semiconductor integrated circuit (IC). A semiconductor IC includes a complementary metal oxide semiconductor (CMOS), for example, and specifically, formed by a silicon on insulator (SOI) process. Accordingly, such a semiconductor IC can be manufactured at a low cost. Note that the semiconductor IC may include at least one of gallium arsenide (GaAs), silicon germanium (SiGe), or gallium nitride (GaN). Thus, a radio frequency signal having high amplification quality and high noise quality can be output.

Low noise amplifier 20 amplifies radio frequency signals in communication bands A and B while noise is kept low, and outputs the amplified radio frequency signals to reception output terminal 120.

Transmission filter 30T is disposed on transmission path AT that connects transmission amplifier circuit 10 and antenna connection terminal 100, and passes a transmission signal in the transmission band of communication band A, within a transmission signal amplified by transmission amplifier circuit 10. Transmission filter 40T is disposed on transmission path BT that connects transmission amplifier circuit 10 and antenna connection terminal 100, and passes a transmission signal in the transmission band of communication band B, within a transmission signal amplified by transmission amplifier circuit 10.

Reception filter 30R is disposed on reception path AR that connects low noise amplifier 20 and antenna connection terminal 100, and passes a reception signal in the reception band of communication band A, within a reception signal input through antenna connection terminal 100. Reception filter 40R is disposed on reception path BR that connects low noise amplifier 20 and antenna connection terminal 100, and passes a reception signal in the reception band of communication band B, within a reception signal input through antenna connection terminal 100.

Transmission filter 30T and reception filter 30R are included in duplexer 30 having a passband that is communication band A. Duplexer 30 transfers a transmission signal and a reception signal in communication band A by frequency division duplex (FDD). Transmission filter 40T and reception filter 40R are included in duplexer 40 having a passband that is communication band B. Duplexer 40 transfers a transmission signal and a reception signal in communication band B by FDD.

Note that duplexers 30 and 40 may each be a multiplexer that includes only a plurality of transmission filters, a multiplexer that includes only a plurality of reception filters, or a multiplexer that includes a plurality of duplexers. Transmission filter 30T and reception filter 30R may not be included in duplexer 30, and may be a single filter for signals transferred by time division duplex (TDD). In this case, one or more switches that switch between transmission and reception are disposed upstream, disposed downstream, or disposed upstream and downstream from transmission filter 30T and reception filter 30R.

Matching circuit 61 is disposed on a path that connects switch 53 and duplexer 30, and matches the impedance between (i) duplexer 30 and (ii) diplexer 35 and switch 53. Matching circuit 62 is disposed on a path that connects switch 53 and duplexer 40, and matches the impedance between (i) duplexer 40 and (ii) diplexer 35 and switch 53.

Matching circuit 63 is disposed on transmission paths between transmission amplifier circuit 10 and transmission filters 30T and 40T, and matches the impedance between transmission amplifier circuit 10 and transmission filter 30T and the impedance between transmission amplifier circuit 10 and transmission filter 40T. Matching circuit 64 is disposed on reception paths that connect low noise amplifier 20 and reception filters 30R and 40R, and matches the impedance between low noise amplifier 20 and reception filter 30R and the impedance between low noise amplifier 20 and reception filter 40R.

Switch 51 is an example of a second switch and includes a common terminal and two selection terminals. The common terminal of switch 51 is connected to an output terminal of transmission amplifier circuit 10 via matching circuit 63. In other words, switch 51 is a second switch disposed on the output terminal side of power amplifier 10A (refer to FIG. 2). One of the selection terminals of switch 51 is connected to transmission filter 30T, and the other selection terminal of switch 51 is connected to transmission filter 40T. This connection configuration allows switch 51 to switch connection of transmission amplifier circuit 10 between transmission filter 30T and transmission filter 40T. Switch 51 includes a single pole double throw (SPDT) switch circuit, for example.

Switch 52 includes a common terminal and two selection terminals. The common terminal of switch 52 is connected to an input terminal of low noise amplifier 20 via matching circuit 64. One of the selection terminals of switch 52 is connected to reception filter 30R, and the other selection terminal of switch 52 is connected to reception filter 40R. This connection configuration allows switch 52 to switch between connection and disconnection of low noise amplifier 20 to/from reception filter 30R and between connection and disconnection of low noise amplifier 20 to/from reception filter 40R. Switch 52 includes an SPDT switch circuit, for example.

Switch 53 is an example of an antenna switch and is connected to antenna connection terminal 100 via diplexer 35, and switches connection of antenna connection terminal 100 between (1) transmission path AT and reception path AR and (2) transmission path BT and reception path BR. Note that switch 53 includes a multiple connection switch circuit that allows simultaneous connections of (1) and (2) above.

Switch 54 is an example of a first switch and includes a common terminal and two selection terminals. The common terminal of switch 54 is connected to an input terminal of transmission amplifier circuit 10. In other words, switch 54 is a first switch disposed on the input terminal side of power amplifier 10A. One of the selection terminals of switch 54 is connected to transmission input terminal 111, and the other selection terminal of switch 54 is connected to transmission input terminal 112. This connection configuration allows switch 54 to switch connection of transmission amplifier circuit 10 between transmission input terminal 111 and transmission input terminal 112. Switch 54 includes an SPDT switch circuit, for example.

In this case, a transmission signal in communication band A, for example, is input through transmission input terminal 111, and a transmission signal in communication band B, for example, is input through transmission input terminal 112. Further, a transmission signal in communication band A or B in the fourth generation mobile communication system (4G), for example, may be input through transmission input terminal 111, and a transmission signal in communication band A or B in the fifth generation mobile communication system (5G), for example, may be input through transmission input terminal 112.

Note that switch 54 may have a configuration in which the common terminal is connected to a transmission input terminal, one of the selection terminals is connected to a first transmission amplifier circuit that amplifies a transmission signal in communication band A, and the other selection terminal is connected to a second transmission amplifier circuit that amplifies a transmission signal in communication band B.

In this case, transmission signals in communication bands A and B, for example, are input through transmission input terminal 111. A transmission signal in communication band A in 4G and a transmission signal in communication band B in 5G, for example, may be input through transmission input terminal 112.

Switch 54 may be achieved by a double pole double throw (DPDT) switch circuit that includes two common terminals and two selection terminals. In this case, transmission input terminal 111 is connected to one of the common terminals, and transmission input terminal 112 is connected to the other common terminal. The one common terminal is connected to a first transmission amplifier circuit that amplifies a transmission signal in communication band A, and the other common terminal is connected to a second transmission amplifier circuit that amplifies a transmission signal in communication band B. This connection configuration allows switch 54 to switch connection of the one common terminal between one of the selection terminals and the other selection terminal, and switch connection of the other common terminal between the one selection terminal and the other selection terminal.

In this case, for example, a transmission signal in communication band A is input through transmission input terminal 111, and a transmission signal in communication band B is input through transmission input terminal 112. For example, transmission signals in communication bands A and B in 4G may be input through transmission input terminal 111, and transmission signals in communication bands A and B in 5G may be input through transmission input terminal 112.

Diplexer 35 is an example of a multiplexer, and includes filters 35L and 35H. Filter 35L has a passband that is a frequency range including communication bands A and B, and filter 35H has a passband that is a different frequency range other than the frequency range including communication bands A and B. One terminal of filter 35L and one terminal of filter 35H are connected in common to antenna connection terminal 100. Filters 35L and 35H are each an LC filter that includes at least one of a chip inductor or a chip capacitor, for example. Note that when the frequency range including communication bands A and B is lower than the above different frequency range, filter 35L may be a low pass filter, and filter 35H may be a high pass filter.

Note that transmission filters 30T and 40T and reception filters 30R and 40R described above may each be one of, for example, an acoustic wave filter that uses surface acoustic waves (SAWs), an acoustic wave filter that uses bulk acoustic waves (BAWs), an inductor-capacitor (LC) resonance filter, and a dielectric filter, and furthermore, are not limited to those filters.

Matching circuits 61 to 64 are not necessarily included in the radio frequency module according to the present disclosure.

In the configuration of radio frequency module 1, transmission amplifier circuit 10, matching circuit 63, switch 51, transmission filter 30T, matching circuit 61, switch 53, and filter 35L are included in a first transmission circuit that transfers transmission signals in communication band A toward antenna connection terminal 100. Filter 35L, switch 53, matching circuit 61, reception filter 30R, switch 52, matching circuit 64, and low noise amplifier 20 are included in a first reception circuit that transfers reception signals in communication band A from antenna 2 through antenna connection terminal 100.

Transmission amplifier circuit 10, matching circuit 63, switch 51, transmission filter 40T, matching circuit 62, switch 53, and filter 35L are included in a second transmission circuit that transfers transmission signals in communication band B toward antenna connection terminal 100. Filter 35L, switch 53, matching circuit 62, reception filter 40R, switch 52, matching circuit 64, and low noise amplifier 20 are included in a second reception circuit that transfers reception signals in communication band B from antenna 2 through antenna connection terminal 100.

According to the above circuit configuration, radio frequency module 1 can carry out at least one of transmission, reception, or transmission and reception of a radio frequency signal in communication band A or B. Furthermore, radio frequency module 1 can carry out at least one of simultaneous transmission, simultaneous reception, or simultaneous transmission and reception of radio frequency signals in communication bands A and B.

Note that in the radio frequency module according to the present disclosure, the two transmission circuits and the two reception circuits may not be connected to antenna connection terminal 100 via switch 53, and may be connected to antenna 2 via different terminals. It is sufficient if the radio frequency module according to the present disclosure includes at least one of the first transmission circuit or the second transmission circuit.

In the radio frequency module according to the present disclosure, it is sufficient if the first transmission circuit includes transmission amplifier circuit 10 and at least one element out of transmission filter 30T, switches 51 and 53, and matching circuits 61 and 63. It is sufficient if the second transmission circuit includes transmission amplifier circuit 10 and at least one element out of transmission filter 40T, switches 51 and 53, and matching circuits 62 and 63.

Low noise amplifier 20 and switches 51 to 54 may be formed in a single semiconductor IC. The semiconductor IC includes a CMOS, for example, and is specifically formed by the SOI process. Accordingly, such a semiconductor IC can be manufactured at a low cost. Note that the semiconductor IC may include at least one of GaAs, SiGe, or GaN. Thus, a radio frequency signal having high amplification quality and high noise quality can be output.

Figure 2:
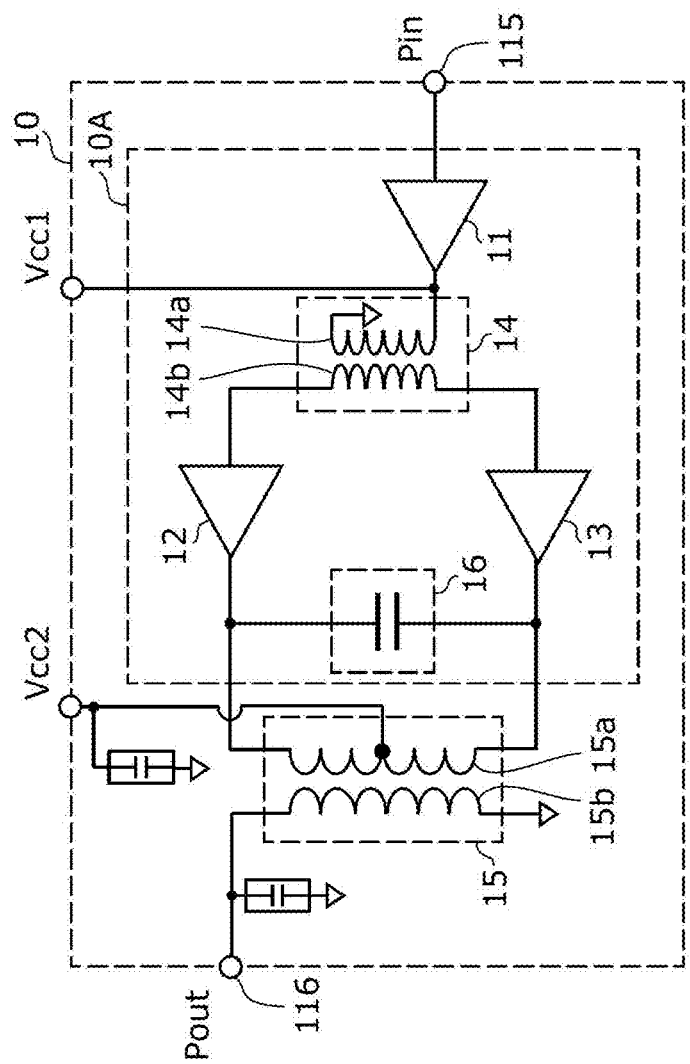
FIG. 2 illustrates a circuit configuration of a transmission amplifier circuit.

FIG. 2 illustrates a circuit configuration of transmission amplifier circuit 10 according to the embodiment. As illustrated in FIG. 2, transmission amplifier circuit 10 includes input terminal 115, output terminal 116, amplifying element 12 (a first amplifying element), amplifying element 13 (a second amplifying element), amplifying element 11 (a third amplifying element), interstage transformer (transformer) 14, capacitor 16, and output transformer (unbalance-balance transforming element) 15.

Interstage transformer 14 includes primary coil 14a and secondary coil 14b.

An input terminal of amplifying element 11 is connected to input terminal 115, and an output terminal of amplifying element 11 is connected to an unbalance terminal of interstage transformer 14. One balance terminal of interstage transformer 14 is connected to an input terminal of amplifying element 12, and the other balance terminal of interstage transformer 14 is connected to an input terminal of amplifying element 13.

A radio frequency signal input through input terminal 115 is amplified by amplifying element 11 in a state in which bias voltage Vcc1 is applied to amplifying element 11. Interstage transformer 14 applies unbalance-balance transform to the amplified radio frequency signal. At this time, a non-inverted input signal is output through the one balance terminal of interstage transformer 14, and an inverted input signal is output through the other balance terminal of interstage transformer 14.

Output transformer 15 includes primary coil (first coil) 15a and secondary coil (second coil) 15b. One end of primary coil 15a is connected to an output terminal of amplifying element 12, and the other end of primary coil 15a is connected to an output terminal of amplifying element 13. Bias voltage Vcc2 is supplied to a middle point of primary coil 15a. One end of secondary coil 15b is connected to output terminal 116, and the other end of secondary coil 15b is connected to the ground. Stated differently, output transformer 15 is connected between (i) output terminal 116 and (ii) the output terminal of amplifying element 12 and the output terminal of amplifying element 13.

Capacitor 16 is connected between the output terminal of amplifying element 12 and the output terminal of amplifying element 13.

Impedance of a non-inverted input signal amplified by amplifying element 12 and impedance of an inverted input signal amplified by amplifying element 13 are transformed by output transformer 15 and capacitor 16 while the signals are maintained in antiphase with each other. Specifically, output transformer 15 and capacitor 16 match output impedance of power amplifier 10A at output terminal 116 to input impedance of matching circuit 63, switch 51, and transmission filters 30T and 40T illustrated in FIG. 1. Note that a capacitive element connected between the ground and a path that connects output terminal 116 and secondary coil 15b contributes to the impedance matching. Note that the capacitive element may be disposed in series on a path that connects output terminal 116 and secondary coil 15b, or may not be provided.

Here, amplifying elements 11 to 13, interstage transformer 14, and capacitor 16 constitute power amplifier 10A. In particular, amplifying elements 11 and 13 and interstage transformer 14 are integrally formed in many cases, by being formed in a single chip or being mounted on the same substrate, for instance. In contrast, output transformer 15 needs to have a high Q factor to handle a high-power transmission signal, and thus is not formed integrally with amplifying elements 11 to 13 or interstage transformer 14, for instance. Stated differently, among circuit components included in transmission amplifier circuit 10, circuit components except output transformer 15 are included in power amplifier 10A.

Note that amplifying element 11 and capacitor 16 are not necessarily included in power amplifier 10A.

According to the circuit configuration of transmission amplifier circuit 10, amplifying elements 12 and 13 operate in antiphase with each other. At this time, fundamental-wave currents flow through amplifying elements 12 and 13 in antiphase with each other, that is, in opposite directions, and thus a resultant fundamental-wave current does not flow into a ground line or a power supply line disposed at a substantially equal distance from amplifying elements 12 and 13. Accordingly, inflow of unnecessary currents to the above lines can be disregarded, and thus a decrease in power gain that is seen in a conventional transmission amplifier circuit can be reduced. Further, a non-inverted signal and an inverted signal amplified by amplifying elements 12 and 13 are combined, and thus noise components superimposed similarly on the signals can be cancelled out, and unnecessary waves such as harmonic components, for example, can be decreased.

Note that amplifying element 11 is not necessarily included in transmission amplifier circuit 10. An element that transforms an unbalanced input signal into a non-inverted input signal and an inverted input signal is not limited to interstage transformer 14. Capacitor 16 is not an essential element for impedance matching.

Amplifying elements 11 to 13 and low noise amplifier 20 each include a field effect transistor (FET) or a heterobipolar transistor (HBT) made of a silicon-based CMOS or GaAs, for example.

Note that transmission amplifier circuit 10 may not include difference amplifying type power amplifier 10A, and may include a so-called single-ended amplifying element that receives an unbalanced signal, and outputs an unbalanced signal.

Here, in a radio frequency module that includes a transmission amplifier circuit and a control circuit, heat generated by an amplifying element that outputs a high-power transmission signal locally increases the temperature in the transmission amplifier circuit, and causes variations in the temperature between the transmission amplifier circuit and the control circuit. The amplification characteristics of the amplifying element of the transmission amplifier circuit are temperature-dependent. Accordingly, if temperature variations are caused between the transmission amplifier circuit and the control circuit, a problem arises that output characteristics of the transmission amplifier circuit deteriorate.

To address this, radio frequency module 1 according to the present embodiment has a configuration in which deterioration in output characteristics of transmission amplifier circuit 10 is reduced.

Further, when radio frequency module 1 is mounted on a single mounting board, many circuit elements (amplifying elements 11 to 13, interstage transformer 14, output transformer 15, and capacitor 16) are included in transmission amplifier circuit 10, which results in an increase in the size of radio frequency module 1. If the elements are mounted densely for size reduction, high-power transmission signals output from amplifying elements 12 and 13 interfere with a circuit component included in radio frequency module 1, which leads to a problem that the quality of a radio frequency signal output from radio frequency module 1 deteriorates.

The following describes a configuration of small radio frequency module 1 in which deterioration in output characteristics of transmission amplifier circuit 10 is reduced.

[2. Arrangement of Circuit Elements of Radio Frequency Module 1A According to Example 1]

Figure 3B:
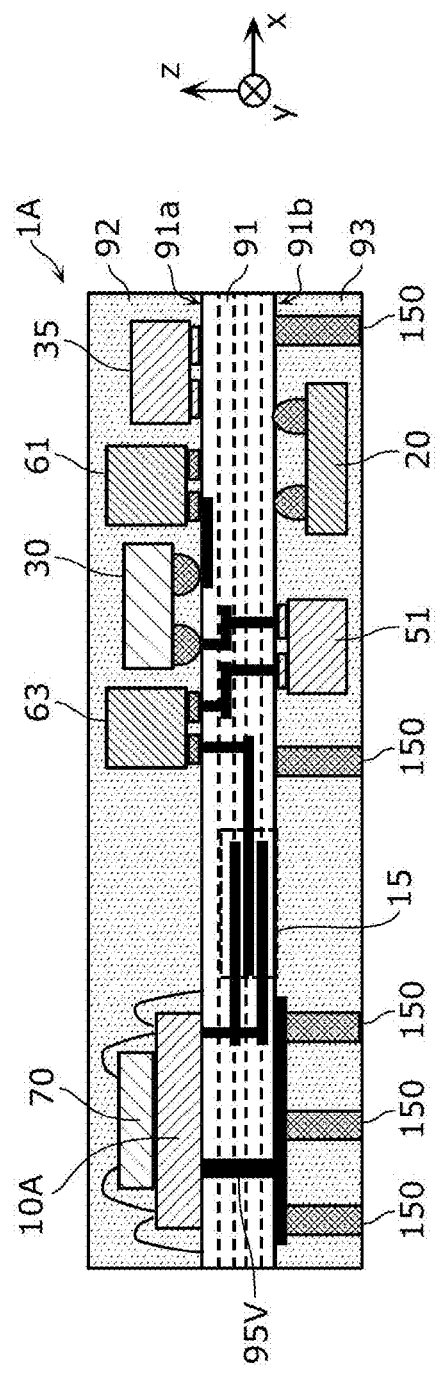
FIG. 3B is a schematic diagram illustrating a cross-sectional configuration of the radio frequency module according to Example 1.

FIG. 3A is a schematic diagram illustrating a planar configuration of radio frequency module 1A according to Example 1. FIG. 3B is a schematic diagram illustrating a cross-sectional configuration of radio frequency module 1A according to Example 1, and specifically, illustrates a cross section taken along line IIIB to IIIB in FIG. 3A. Note that (a) of FIG. 3A illustrates a layout of circuit elements when principal surface 91a out of principal surfaces 91a and 91b on opposite sides of module board 91 is viewed from the positive z-axis. On the other hand, (b) of FIG. 3A is a perspective view of a layout of circuit elements when principal surface 91b is viewed from the positive z-axis. FIG. 3A illustrates output transformer 15 disposed inside of module board 91 with dashed lines.

Radio frequency module 1A according to Example 1 shows a specific arrangement of circuit elements included in radio frequency module 1 according to the embodiment.

As illustrated in FIGS. 3A and 3B, radio frequency module 1A according to this example further includes module board 91, resin members 92 and 93, and external-connection terminals 150, in addition to the circuit configuration illustrated in FIG. 1.

Module board 91 is a board which includes principal surface 91a (a first principal surface) and principal surface 91b (a second principal surface) on opposite sides of module board 91, and on which the transmission circuits and the reception circuits described above are mounted. As module board 91, one of a low temperature co-fired ceramics (LTCC) board, a high temperature co-fired ceramics (HTCC) board, a component-embedded board, a board that includes a redistribution layer (RDL), and a printed circuit board, each having a stacked structure of a plurality of dielectric layers, is used, for example.

Resin member 92 is provided on principal surface 91a of module board 91, covers at least partially the transmission circuits, at least partially the reception circuits, and principal surface 91a of module board 91, and has a function of ensuring reliability of mechanical strength and moisture resistance, for instance, of the circuit elements included in the transmission circuits and the reception circuits. Resin member 93 is provided on principal surface 91b of module board 91, covers at least partially the transmission circuits, at least partially the reception circuits, and principal surface 91b of module board 91, and has a function of ensuring reliability of mechanical strength and moisture resistance, for instance, of the circuit elements included in the transmission circuits and the reception circuits. Note that resin members 92 and 93 are not necessarily included in the radio frequency module according to the present disclosure.

As illustrated in FIGS. 3A and 3B, in radio frequency module 1A according to this example, power amplifier 10A, PA control circuit 80, switch 54, duplexers 30 and 40, matching circuits 61 to 64, and diplexer 35 are disposed on principal surface 91a (the first principal surface) of module board 91. On the other hand, low noise amplifier 20 and switches 51 to 53 are disposed on principal surface 91b (the second principal surface) of module board 91. Output transformer 15 is disposed inside of module board 91. Furthermore, power amplifier 10A and semiconductor IC 70 that includes PA control circuit 80 and switch 54 are stacked on principal surface 91a.

Stated differently, in this example, power amplifier 10A and PA control circuit 80 are stacked on principal surface 91a (the first principal surface). On the other hand, low noise amplifier 20 is a first circuit component, and is mounted on principal surface 91b (the second principal surface).

Note that duplexers 30 and 40, switch 54, matching circuits 61 to 64, and diplexer 35 are mounted on principal surface 91a (the first principal surface), but may be mounted on principal surface 91b (the second principal surface). Switches 51 to 53 are mounted on principal surface 91b (the second principal surface), but may be mounted on principal surface 91a (the first principal surface). The first circuit component disposed on principal surface 91b may not be low noise amplifier 20, and may be another circuit component.

According to the above configuration, power amplifier 10A that outputs a high-power transmission signal and generates a great amount of heat and PA control circuit 80 are stacked, and thus a difference in temperature between power amplifier 10A and PA control circuit 80 can be reduced. Accordingly, power amplifier 10A and PA control circuit 80 are disposed under the same temperature environment, and thus response precision of amplifying elements 12 and 13 that operate under the control of PA control circuit 80 can be increased. Accordingly, PA control circuit 80 can control amplification characteristics of amplifying elements 12 and 13 highly precisely, and thus the amplification characteristics can be optimized. Consequently, deterioration in output characteristics of transmission amplifier circuit 10 can be reduced.

Further, transmission amplifier circuit 10 includes at least amplifying elements 12 and 13, interstage transformer 14, and output transformer 15, and thus includes many components, which leads to an increase in a mounting area. Consequently, the size of the radio frequency module is likely to increase.

To address this, according to the above configuration of radio frequency module 1A according to this example, power amplifier 10A of transmission amplifier circuit 10 and the first circuit component are separately disposed on the two sides of module board 91, and thus radio frequency module 1A can be miniaturized.

As in this example, when the first circuit component is low noise amplifier 20, power amplifier 10A that amplifies a transmission signal and low noise amplifier 20 that amplifies a reception signal are separately disposed on the two sides, and thus the level of isolation between transmission and reception can be increased. Low noise amplifier 20 and PA control circuit 80 are disposed with module board 91 being located therebetween, and thus deterioration in reception sensitivity due to digital noise from control signals input to and output from PA control circuit 80 can be reduced.

Note that desirably, module board 91 has a multilayer structure in which a plurality of dielectric layers are stacked, and a ground electrode pattern is formed on at least one of the dielectric layers. Accordingly, the electromagnetic field shielding function of module board 91 improves.

In this example, power amplifier 10A is directly disposed on principal surface 91a, and PA control circuit 80 is disposed on power amplifier 10A. Accordingly, module board 91, power amplifier 10A, and PA control circuit 80 are stacked in this order.

According to this, heat generated by power amplifier 10A can be readily diffused to module board 91, and thus heat dissipation of radio frequency module 1A improves. PA control circuit 80 can be prevented from being damaged by heat from power amplifier 10A.

In radio frequency module 1A according to this example, PA control circuit 80 and switch 54 are included in single semiconductor IC 70, and semiconductor IC 70 is disposed on principal surface 91a (the first principal surface).

Accordingly, transmission amplifier circuit 10, and PA control circuit 80 and switch 54 that are connected to transmission amplifier circuit 10 are stacked, and thus radio frequency module 1A can be further miniaturized.

Note that semiconductor IC 70 may include switch 51 instead of switch 54. Semiconductor IC 70 may include both of switches 51 and 54.

In this example, as illustrated in FIG. 3B, an input output electrode formed on the upper surface (a surface located in the positive z-axis in FIG. 3B) of semiconductor IC 70 and an input output electrode formed on the upper surface (a surface located in the positive z-axis in FIG. 3B) of power amplifier 10A are directly connected by a bonding wire, without module board 91 being located therebetween. Specifically, an electrode (a first input output electrode) formed on PA control circuit 80 in semiconductor IC 70 and an electrode (a second input output electrode) formed on power amplifier 10A are directly connected by a bonding wire, without module board 91 being located therebetween.

According to this, a control line that connects PA control circuit 80 and power amplifier 10A can be shortened, and thus noise generated from the control line can be reduced.

Note that the control line that directly connects the electrode on PA control circuit 80 and the electrode on power amplifier 10A is not limited to a bonding wire, and may be a side line formed on the side of semiconductor IC 70, or may be a via conductor that extends inside of semiconductor IC 70 in a normal direction that is normal to principal surface 91a.

Note that amplifying elements 12 and 13 of power amplifier 10A may be made of GaAs, and semiconductor IC 70 may be made of Si. In this case, heat conductivity of Si is higher than GaAs, and thus heat locally generated in power amplifier 10A is first conducted to semiconductor IC 70, and is diffused to the whole stack of power amplifier 10A and semiconductor IC 70. After the heat diffusion to the whole stack, the heat is dissipated to module board 91 through power amplifier 10A, and thus efficiency of heat dissipation improves.

In radio frequency module 1A according to this example, external-connection terminals 150 are disposed on principal surface 91b of module board 91. Radio frequency module 1A exchanges electrical signals with a motherboard disposed on the negative z-axis side of radio frequency module 1A, via external-connection terminals 150. As illustrated in (b) of FIG. 3A, the external-connection terminals include antenna connection terminal 100, transmission input terminals 111 and 112, and reception output terminal 120. Potential of some of external-connection terminals 150 is set to the ground potential of the motherboard. On principal surface 91b facing the motherboard out of principal surfaces 91a and 91b, power amplifier 10A whose height is not readily decreased is not disposed, and low noise amplifier 20 whose height is readily decreased is disposed, and thus the height of radio frequency module 1A as a whole can be decreased. Further, external-connection terminals 150 used as ground electrodes are disposed around low noise amplifier 20 that greatly affects reception sensitivity of the reception circuits, and thus deterioration in reception sensitivity of the reception circuits can be reduced.

Power amplifier 10A is a component that generates a great amount of heat, out of circuit components included in radio frequency module 1A. In order to improve heat dissipation of radio frequency module 1A, it is important to dissipate heat generated by power amplifier 10A to the motherboard through heat dissipation paths having low heat resistance. If power amplifier 10A is mounted on principal surface 91b, an electrode line connected to power amplifier 10A is disposed on principal surface 91b. Accordingly, the heat dissipation paths include a heat dissipation path along only a planar line pattern (in the xy plane direction) on principal surface 91b. The planar line pattern is formed of a thin metal film, and thus has high heat resistance. Accordingly, if power amplifier 10A is disposed on principal surface 91b, heat dissipation deteriorates.

To address this, radio frequency module 1A according to this example further includes heat-dissipating via conductor 95V that is connected to a ground electrode of power amplifier 10A on principal surface 91a, and extends from principal surface 91a to principal surface 91b, as illustrated in FIG. 3B. Heat-dissipating via conductor 95V is connected, on principal surface 91b, to external-connection terminals 150 having a ground potential out of external-connection terminals 150.

According to this configuration, when power amplifier 10A is mounted on principal surface 91a, power amplifier 10A and external-connection terminal 150 can be connected through heat-dissipating via conductor 95V. Accordingly, as heat dissipation paths for power amplifier 10A, a heat dissipation path extending along only a planar line pattern in the xy plane direction and having high heat resistance can be excluded from lines on and in module board 91. Thus, miniaturized radio frequency module 1A having improved heat dissipation from power amplifier 10A to the motherboard can be provided.

Note that low noise amplifier 20 and switches 51 to 53 may be included in single semiconductor IC. Accordingly, radio frequency module 1A can be miniaturized.

In radio frequency module 1A according to this example, output transformer 15 is formed inside of module board 91.

Here, as illustrated in FIGS. 3A and 3B, external-connection terminals 150 having the ground potential are disposed between output transformer 15 and low noise amplifier 20, in a plan view of module board 91.

Accordingly, output transformer 15 that transfers a high-power transmission signal and low noise amplifier 20 that transfers a reception signal are isolated by external-connection terminals 150 having the ground potential, and thus isolation between transmission and reception is strengthened.

Further, in a plan view of module board 91, desirably, no circuit component is disposed in regions in principal surfaces 91a and 91b that overlap a formation region in which output transformer 15 is formed, as illustrated in FIGS. 3A and 3B.

Output transformer 15 transfers a high-power transmission signal amplified by power amplifier 10A, and thus the Q factor of an inductor included in output transformer 15 is desirably high. If one or more circuit components are in a region that overlaps output transformer 15 in the above plan view, an electromagnetic field formed by the inductor is influenced by the one or more circuit components, and the Q factor of the inductor decreases, and power of a transmission signal output from output transformer 15 decreases. To address this, the above configuration can reduce a decrease in amplification performance of transmission amplifier circuit 10.

Note that in this example, output transformer 15 is formed inside of module board 91, between principal surface 91a and principal surface 91b, and is offset toward principal surface 91b. In this case, in a plan view of module board 91, no circuit component is disposed in a region in principal surface 91b that overlaps the formation region in which output transformer 15 is formed, and one or more circuit components (not illustrated) may be disposed in a region in principal surface 91a that overlaps the formation region in which output transformer 15 is formed.

Even in this case, no circuit component is disposed in the above region in principal surface 91b closer to output transformer 15, and thus a decrease in the Q factor of the inductor of output transformer 15 can be reduced.

Figure 4A:
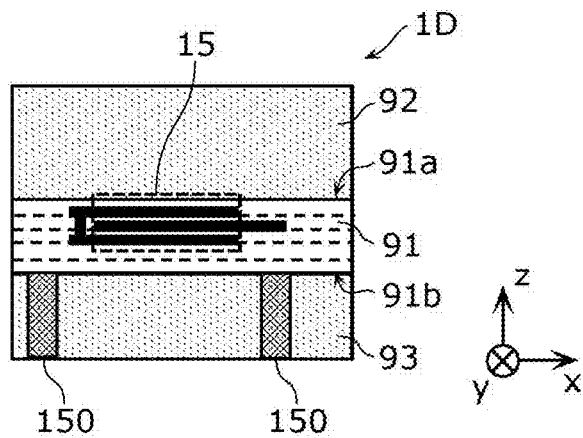
FIG. 4A is a schematic diagram illustrating a cross-sectional configuration of an output transformer according to Variation 1.

FIG. 4A is a schematic diagram of a cross-sectional configuration illustrating the position of output transformer 15 in radio frequency module 1D according to Variation 1. FIG. 4A illustrates the position of output transformer 15 in the cross-sectional configuration of radio frequency module 1D according to Variation 1. Note that the arrangement of circuit components included in radio frequency module 1D other than output transformer 15 is the same as that of radio frequency module 1A according to Example 1. In radio frequency module 1D, output transformer 15 is formed inside of module board 91, between principal surface 91a and principal surface 91b, and is offset toward principal surface 91a. In this case, in a plan view of module board 91, no circuit component is disposed in a region in principal surface 91a that overlaps the formation region in which output transformer 15 is formed, and one or more circuit components (not illustrated) may be disposed in a region in principal surface 91b that overlaps the formation region in which output transformer 15 is formed.

Even in this case, no circuit component is disposed in the above region in principal surface 91a closer to output transformer 15, and thus a decrease in the Q factor of the inductor of output transformer 15 can be reduced.

Figure 4B:
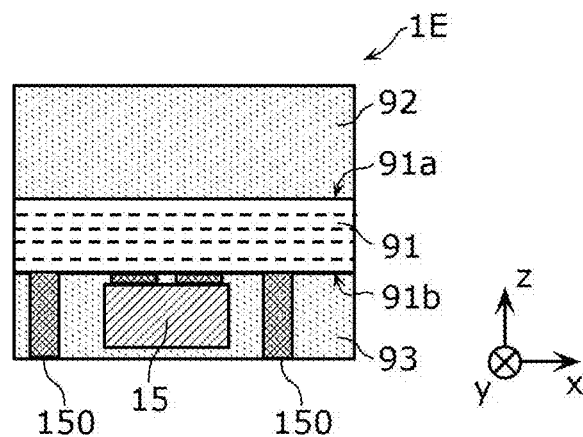
FIG. 4B is a schematic diagram illustrating a cross-sectional configuration of an output transformer according to Variation 2.

FIG. 4B is a schematic diagram of a cross-sectional configuration illustrating the position of output transformer 15 in radio frequency module 1E according to Variation 2. FIG. 4B illustrates the position of output transformer 15 in the cross-sectional configuration of radio frequency module 1E according to Variation 2. Note that the arrangement of circuit components included in radio frequency module 1E other than output transformer 15 is the same as that of radio frequency module 1A according to Example 1. In radio frequency module 1E, output transformer 15 is disposed on principal surface 91b. In this case, desirably, no circuit component is disposed in a region in principal surface 91a that overlaps the formation region in which output transformer 15 is formed, in a plan view of module board 91.

According to this configuration, no circuit component is disposed in the above region in principal surface 91a, and thus a decrease in the Q factor of the inductor of output transformer 15 can be reduced.

Figure 4C:
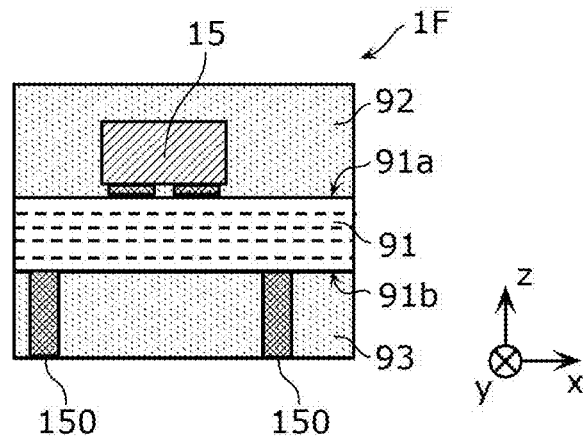
FIG. 4C is a schematic diagram illustrating a cross-sectional configuration of an output transformer according to Variation 3.

FIG. 4C is a schematic diagram of a cross-sectional configuration illustrating the position of output transformer 15 in radio frequency module 1F according to Variation 3. FIG. 4C illustrates the position of output transformer 15 in the cross-sectional configuration of radio frequency module 1F according to Variation 3. Note that the arrangement of circuit components included in radio frequency module 1F other than output transformer 15 is the same as that of radio frequency module 1A according to Example 1. In radio frequency module 1F, output transformer 15 is disposed on principal surface 91a. In this case, desirably, no circuit component is disposed in a region in principal surface 91b that overlaps the formation region in which output transformer 15 is formed, in a plan view of module board 91.

According to this configuration, no circuit component is disposed in the above region in principal surface 91b, and thus a decrease in the Q factor of the inductor of output transformer 15 can be reduced.

Furthermore, in each of radio frequency modules 1A, 1D, 1E, and 1F, desirably, a ground electrode pattern is not formed in a region that overlaps the formation region in which output transformer 15 is formed, in a plan view of module board 91. According to this configuration, it can be ensured that output transformer 15 and a ground electrode are widely spaced apart from each other, and the Q factor of output transformer 15 can be maintained high.

Note that the formation region in which output transformer 15 is formed is defined as follows. The formation region in which output transformer 15 is formed is a minimum region that includes a formation region in which the primary coil is formed and a formation region in which the secondary coil is formed, in a plan view of module board 91.

Here, secondary coil 15b is defined as a line conductor disposed along primary coil 15a, in a section in which a first distance from primary coil 15a is substantially constant. At this time, portions of the line conductor located on both sides of the above section are spaced apart from primary coil 15a by a second distance longer than the first distance, and one end and the other end of secondary coil 15b are points at which a distance from the line conductor to primary coil 15a changes from the first distance to the second distance. Primary coil 15a is defined as a line conductor disposed along secondary coil 15b, in a section in which the first distance from secondary coil 15b is substantially constant. At this time, portions of the line conductor located on both sides of the above section are spaced apart from secondary coil 15b by the second distance longer than the first distance, and one end and the other end of primary coil 15a are points at which a distance from the line conductor to secondary coil 15b changes from the first distance to the second distance.

Alternatively, secondary coil 15b is defined as a line conductor disposed along primary coil 15a, in a first section in which the line width is a substantially constant first width. Primary coil 15a is defined as a line conductor disposed along secondary coil 15b, in the first section in which the line width is the substantially constant first width.

Alternatively, secondary coil 15b is defined as a line conductor disposed along primary coil 15a, in a first section in which the thickness is a substantially constant first thickness. Primary coil 15a is defined as a line conductor disposed along secondary coil 15b, in the first section in which the thickness is the substantially constant first thickness.

Alternatively, secondary coil 15b is defined as a line conductor disposed along primary coil 15a, in a first section in which a degree of coupling with primary coil 15a is a substantially constant first degree of coupling. Further, primary coil 15a is defined as a line conductor disposed along secondary coil 15b, in the first section in which a degree of coupling with secondary coil 15b is the substantially constant first degree of coupling.

Figure 5:
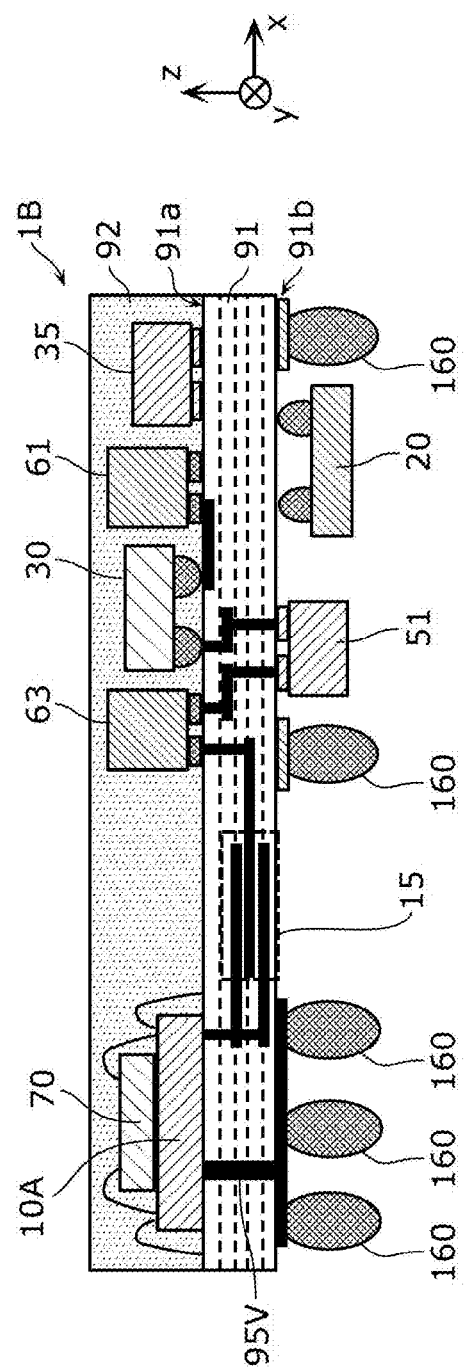
FIG. 5 is a schematic diagram illustrating a cross-sectional configuration of a radio frequency module according to Variation 4.

Note that external-connection terminals 150 may be columnar electrodes passing through resin member 93 in the z-axis direction as illustrated in FIGS. 3A and 3B, or may be bump electrodes 160 formed on principal surface 91b as in radio frequency module 1B according to Variation 4 illustrated in FIG. 5. In this case, resin member 93 may not be provided on principal surface 91b.

In radio frequency module 1A according to Example 1, external-connection terminals 150 may be disposed on principal surface 91a. In radio frequency module 1B according to Variation 4, bump electrodes 160 may be disposed on principal surface 91a.

[3. Arrangement of Circuit Elements of Radio Frequency Module 1C According to Example 2]

Figure 6A:
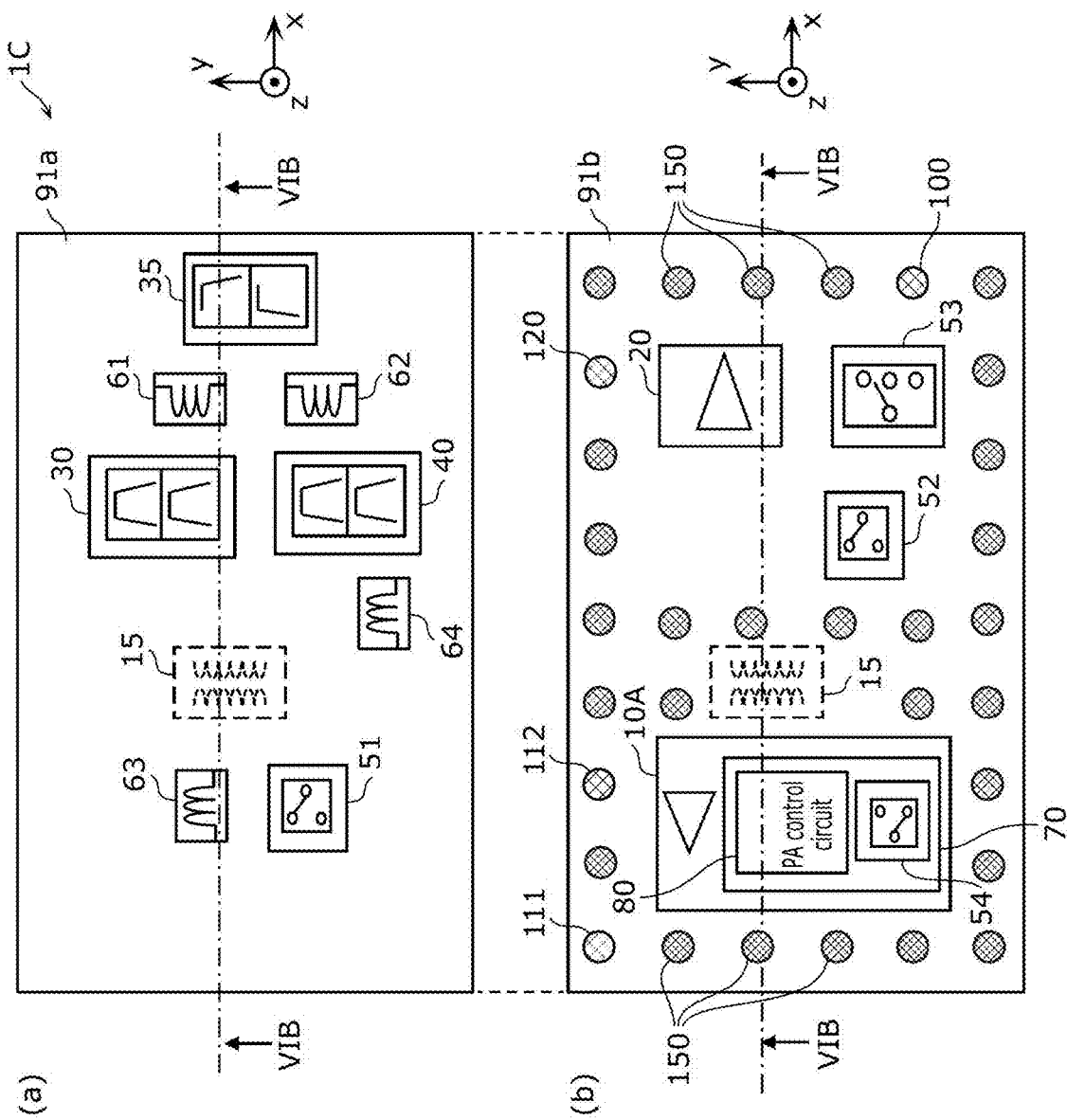
FIG. 6A is a schematic diagram illustrating a planar configuration of a radio frequency module according to Example 2.
Figure 6B:
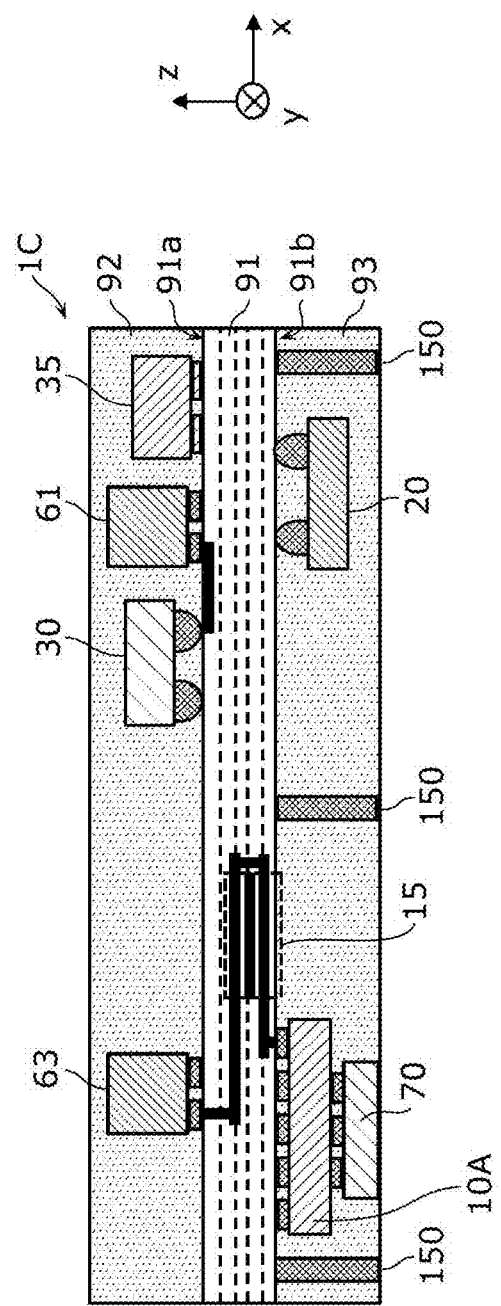
FIG. 6B is a schematic diagram illustrating a cross-sectional configuration of the radio frequency module according to Example 2.

FIG. 6A is a schematic diagram illustrating a planar configuration of radio frequency module 1C according to Example 2. FIG. 6B is a schematic diagram illustrating a cross-sectional configuration of radio frequency module 1C according to Example 2 and specifically, illustrates a cross section taken along line VIB to VIB in FIG. 6A. Note that (a) of FIG. 6A illustrates a layout of circuit elements when principal surface 91a out of principal surfaces 91a and 91b on opposite sides of module board 91 is viewed from the positive z-axis. On the other hand, (b) of FIG. 6A is a perspective view of a layout of circuit elements when principal surface 91b is viewed from the positive z-axis. FIG. 6A illustrates output transformer 15 disposed inside of module board 91 with dashed lines.

Radio frequency module 1C according to Example 2 shows a specific arrangement of circuit elements included in radio frequency module 1 according to the embodiment.

Radio frequency module 1C according to this example is different from radio frequency module 1A according to Example 1, only in the arrangement of the circuit components included in radio frequency module 1C. The following description of radio frequency module 1C according to this example focuses on differences from radio frequency module 1A according to Example 1 while a description of the same points is omitted.

As illustrated in FIGS. 6A and 6B, radio frequency module 1C according to this example further includes module board 91, resin members 92 and 93, and external-connection terminals 150, in addition to the circuit configuration illustrated in FIG. 1.

Module board 91 is a board which includes principal surface 91a (a second principal surface) and principal surface 91b (a first principal surface) on opposite sides of module board 91, and on which the above transmission circuits and the above reception circuits are mounted. As module board 91, for example, one of an LTCC board, an HTCC board, a component-embedded board, a board that includes an RDL, and a printed circuit board each having a stacked structure of a plurality of dielectric layers is used.

As illustrated in FIGS. 6A and 6B, in radio frequency module 1C according to this example, switch 51, duplexers 30 and 40, matching circuits 61 to 64, and diplexer 35 are disposed on principal surface 91a (the second principal surfaces) of module board 91. On the other hand, power amplifier 10A, PA control circuit 80, switch 54, low noise amplifier 20, and switches 52 and 53 are disposed on principal surface 91b (the first principal surface) of module board 91. Output transformer 15 is disposed inside of module board 91. Furthermore, power amplifier 10A and semiconductor IC 70 that includes PA control circuit 80 and switch 54 are stacked on principal surface 91b.

Specifically, in this example, power amplifier 10A and PA control circuit 80 are stacked on principal surface 91b (the first principal surface). On the other hand, switch 51, duplexers 30 and 40, matching circuits 61 to 64, and diplexer 35 are first circuit components, and are mounted on principal surface 91a (the second principal surface).

Note that it is sufficient if at least one element out of switch 51, duplexers 30 and 40, matching circuits 61 to 64, and diplexers 35 is mounted on principal surface 91a (the second principal surface). Switch 54, low noise amplifier 20, and switches 52 and 53 are mounted on principal surface 91b (the first principal surface), but may be mounted on principal surface 91a (the second principal surface).

According to the above configuration, power amplifier 10A that outputs a high-power transmission signal and generates a great amount of heat and PA control circuit 80 are stacked, and thus a difference in temperature between power amplifier 10A and PA control circuit 80 can be reduced. Accordingly, power amplifier 10A and PA control circuit 80 are disposed under the same temperature environment, and thus response precision of amplifying elements 12 and 13 that operate under the control of PA control circuit 80 can be increased. Accordingly, PA control circuit 80 can control amplification characteristics of amplifying elements 12 and 13 highly precisely, and thus the amplification characteristics can be optimized. Accordingly, deterioration in output characteristics of transmission amplifier circuit 10 can be reduced.

Transmission amplifier circuit 10 includes at least amplifying elements 12 and 13, interstage transformer 14, and output transformer 15, and thus includes many components, which leads to an increase in a mounting area. Consequently, the size of the radio frequency module is likely to increase.

To address this, according to the above configuration of radio frequency module 1C according to this example, power amplifier 10A of transmission amplifier circuit 10 and the first circuit components are separately disposed on the two sides of module board 91, and thus, radio frequency module 1C can be miniaturized.

In this example, power amplifier 10A is directly disposed on principal surface 91b, and PA control circuit 80 is disposed on power amplifier 10A. Accordingly, module board 91, power amplifier 10A, and PA control circuit 80 are stacked in this order.

According to this, heat generated by power amplifier 10A can be readily diffused to module board 91, and thus heat dissipation of radio frequency module 1C improves. PA control circuit 80 can be prevented from being damaged by heat from power amplifier 10A.

In radio frequency module 1C according to this example, PA control circuit 80 and switch 54 are included in single semiconductor IC 70, and semiconductor IC 70 is disposed on principal surface 91b (the first principal surface).

Accordingly, transmission amplifier circuit 10, and PA control circuit 80 and switch 54 connected to transmission amplifier circuit 10 are stacked, and thus radio frequency module 1C can be further miniaturized.

Note that semiconductor IC 70 may include switch 51 instead of switch 54. Alternatively, semiconductor IC 70 may include both switches 51 and 54.

In this example, as illustrated in FIG. 6B, an input output electrode formed on a lower surface (a surface located in the positive z-axis in FIG. 6B) of semiconductor IC 70 and an input output electrode formed on an upper surface (a surface located in the negative z-axis in FIG. 6B) of power amplifier 10A are directly connected without module board 91 being located therebetween.

According to this, a control line that connects PA control circuit 80 and power amplifier 10A can be shortened, and thus noise generated from the control line can be reduced.

Note that the control line that directly connects the electrode on PA control circuit 80 and the electrode on power amplifier 10A may be a bonding wire disposed on radio frequency module 1A according to Example 1, or may be a side line formed on the side of semiconductor IC 70, or may be a via conductor that extends inside of semiconductor IC 70 in a normal direction that is normal to principal surface 91a.

In radio frequency module 1C according to this example, a plurality of external-connection terminals 150 are disposed on principal surface 91b of module board 91. Potential of some of external-connection terminals 150 is set to the ground potential of the motherboard. As illustrated in (b) of FIG. 6A, external-connection terminals 150 used as ground electrodes are disposed around low noise amplifier 20 that greatly affects reception sensitivity of the reception circuits, and thus deterioration in reception sensitivity of the reception circuits can be reduced.

Note that as illustrated in (b) of FIG. 6A, external-connection terminals 150 having the ground potential out of external-connection terminals 150 are desirably disposed between PA control circuit 80 and low noise amplifiers 20, in a plan view of module board 91.

Accordingly, external-connection terminals 150 used as ground electrodes are disposed between low noise amplifier 20 and PA control circuit 80, and thus deterioration in reception sensitivity can be further reduced.

In this example, matching circuit 64 at least includes an inductor, and the inductor is disposed on principal surface 91a.

Accordingly, the inductor and PA control circuit 80 that greatly affect reception sensitivity of the reception circuits are disposed with module board 91 being located therebetween, and thus a digital control line connected to PA control circuit 80 and the inductor can be prevented from being coupled via an electromagnetic field. Accordingly, deterioration in reception sensitivity due to digital noise can be reduced.

Note that low noise amplifier 20 and switches 52 and 53 may be included in single semiconductor IC. Accordingly, radio frequency module 1C can be miniaturized.

Note that external-connection terminals 150 may be disposed on principal surface 91a in radio frequency module 1C according to Example 2.

[4. Advantageous Effects]

As described above, radio frequency module 1 according to the present embodiment includes: module board 91 that includes principal surfaces 91a and 91b on opposite sides of module board 91; power amplifier 10A configured to amplify a transmission signal; a first circuit component; and PA control circuit 80 configured to control power amplifier 10A. Power amplifier 10A and PA control circuit 80 are stacked on principal surface 91*a*, and the first circuit component is disposed on principal surface 91*b*.

Accordingly, power amplifier 10A that outputs a high-power transmission signal and generates a great amount of heat and PA control circuit 80 are stacked, and thus a difference in temperature between power amplifier 10A and PA control circuit 80 can be reduced. Hence, power amplifier 10A and PA control circuit 80 are disposed under the same temperature environment, and thus response precision of amplifying elements 12 and 13 that operate under the control of PA control circuit 80 can be increased. Accordingly, PA control circuit 80 can control amplification characteristics of amplifying elements 12 and 13 highly precisely, and thus the amplification characteristics can be optimized. Consequently, deterioration in output characteristics of transmission amplifier circuit 10 can be reduced.

In radio frequency module 1, power amplifier 10A may be disposed on principal surface 91*a*, and PA control circuit 80 may be disposed on power amplifier 10A.

According to this configuration, heat generated by power amplifier 10A can be readily diffused to module board 91, and thus heat dissipation of radio frequency module 1A improves. PA control circuit 80 can be prevented from being damaged by heat from power amplifier 10A.

Radio frequency module 1 may further include: a plurality of external-connection terminals 150 disposed on principal surface 91*b*; and heat-dissipating via conductor 95V connected to a ground electrode of power amplifier 10A, heat-dissipating via conductor 95V extending from principal surface 91*a* to principal surface 91*b*. Heat-dissipating via conductor 95V may be connected, on principal surface 91*b*, to external-connection terminal 150 having a ground potential out of external-connection terminals 150.

According to this configuration, power amplifier 10A and external-connection terminal 150 can be connected via heat-dissipating via conductor 95V. Accordingly, as heat dissipation paths for power amplifier 10A, a heat dissipation path extending along only a planar line pattern in the xy plane direction and having high heat resistance can be excluded from lines on and in module board 91. Thus, miniaturized radio frequency module 1 having improved heat dissipation from power amplifier 10A to the motherboard can be provided.

In radio frequency module 1, the first circuit component may be low noise amplifier 20 disposed on principal surface 91*b*.

Accordingly, power amplifier 10A that amplifies a transmission signal and low noise amplifier 20 that amplifies a reception signal are separately disposed on the two sides, and thus isolation between transmission and reception can be improved. Low noise amplifier 20 and PA control circuit 80 are disposed with module board 91 being located therebetween, and thus deterioration in reception sensitivity due to digital noise from control signals output from and input to PA control circuit 80 can be reduced.

Radio frequency module 1 may further include: switch 54 disposed on an input terminal side of power amplifier 10A; and switch 51 disposed on an output terminal side of power amplifier 10A. PA control circuit 80 and at least one switch out of switches 51 and 54 may be included in single semiconductor IC 70, and power amplifier 10A and single semiconductor IC 70 may be stacked on principal surface 91*a*.

In radio frequency module 1, an input output electrode formed on PA control circuit 80 and an input output electrode formed on power amplifier 10A may be directly connected without module board 91 being located therebetween.

According to this configuration, a control line that connects PA control circuit 80 and power amplifier 10A can be shortened, and thus noise generated from the control line can be reduced.

Radio frequency module 1 may further include output transformer 15 that includes primary coil 15*a* and secondary coil 15*b*. Power amplifier 10A may include amplifying elements 12 and 13. An end of primary coil 15*a* may be connected to an output terminal of amplifying element 12. Another end of primary coil 15*a* may be connected to an output terminal of amplifying element 13. An end of secondary coil 15*b* may be connected to an output terminal of power amplifier 10A. Power amplifier 10A and output transformer 15 may be included in transmission amplifier circuit 10.

According to this configuration, amplifying elements 12 and 13 operate in antiphase with each other, and thus the fall of power gains can be reduced. Further, a non-inverted signal and an inverted signal amplified by amplifying elements 12 and 13 are combined, and thus noise components superimposed similarly on the signals can be cancelled out, and unnecessary waves such as harmonic components, for example, can be decreased.

There is concern that the size of radio frequency module 1 is increased since many circuit elements (amplifying elements 11 to 13, interstage transformer 14, output transformer 15, and capacitor 16) are included in transmission amplifier circuit 10, yet power amplifier 10A of transmission amplifier circuit 10 and the first circuit component are separately disposed on the two sides of module board 91, and thus radio frequency module 1 can be miniaturized.

In radio frequency module 1F, desirably, output transformer 15 is disposed on principal surface 91*a*, and in a plan view of module board 91, no circuit component is disposed in a region included in principal surface 91*b* and overlapping output transformer 15.

According to this configuration, no circuit component is disposed in the above region in principal surface 91*b*, and thus a decrease in the Q factor of the inductor of output transformer 15 can be reduced.

In radio frequency module 1E, desirably, output transformer 15 is disposed on principal surface 91*b*, and in a plan view of module board 91, no circuit component is disposed in a region included in principal surface 91*a* and overlapping output transformer 15.

According to this configuration, no circuit component is disposed in the above region in principal surface 91*a*, and thus a decrease in the Q factor of the inductor of output transformer 15 can be reduced.

In radio frequency modules 1A and 1D, desirably, output transformer 15 is disposed inside of module board 91, between principal surface 91*a* and principal surface 91*b*, and in a plan view of module board 91, no circuit component is disposed in regions included in principal surfaces 91*a* and 91*b* and overlapping output transformer 15.

According to this configuration, no circuit component is disposed in the above regions in principal surfaces 91*a* and 91*b*, and thus a decrease in the Q factor of the inductor of output transformer 15 can be reduced.

In each of radio frequency modules 1A and 1D, output transformer 15 may be disposed inside of module board 91, between principal surface 91*a* and principal surface 91*b*, output transformer being offset toward one of principal surface 91a and principal surface 91b, and in a plan view of module board 91, no circuit component is disposed in a region included in the one of principal surface 91a and principal surface 91b and overlapping output transformer 15, and a circuit component may be disposed in a region included in a remaining one of principal surface 91a and principal surface 91b and overlapping output transformer 15.

Even in this case, no circuit component is disposed in the above region in principal surface 91a closer to output transformer 15, and thus a decrease in the Q factor of the inductor of output transformer 15 can be reduced.

Communication device 5 includes: antenna 2; RFIC 3 configured to process radio frequency signals transmitted and received by antenna 2; and radio frequency module 1 configured to transfer the radio frequency signals between antenna 2 and RFIC 3.

Accordingly, communication device 5 in which deterioration in output characteristics of transmission amplifier circuit 10 is reduced can be provided.

Other Embodiments Etc.

The above has described the radio frequency module and the communication device according to embodiments of the present disclosure, based on an embodiment and examples, yet the radio frequency module and the communication device according to the present disclosure are not limited to the above embodiment and examples. The present disclosure also encompasses another embodiment achieved by combining arbitrary elements in the embodiment and the examples, variations as a result of applying various modifications that may be conceived by those skilled in the art to the embodiment and the examples without departing from the scope of the present disclosure, and various apparatuses that include the radio frequency module and the communication device according to the present disclosure.

For example, in the radio frequency modules and the communication devices according to the embodiment and the examples thereof, another circuit element and another line, for instance, may be disposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion, which supports multiband technology.

The invention claimed is:
1. A radio frequency module, comprising:
a first transmission input terminal;
a second transmission input terminal;
an antenna connection terminal;
a power amplifier;
a first switch configured to switch a first connection between the first transmission input terminal and the power amplifier and a second connection between the second transmission input terminal and the power amplifier;
a first transmission filter;
a second transmission filter;
a second switch configured to switch a third connection between the power amplifier and the first transmission filter and a fourth connection between the power amplifier and the second transmission filter;
a first reception filter;
a low noise amplifier connected to the first reception filter;
a third switch configured to switch a fifth connection between the antenna connection terminal and the first transmission filter and a sixth connection between the antenna connection terminal and the second transmission filter and a seventh connection between the antenna connection terminal and the first reception filter; and
a module board that includes a first principal surface and a second principal surface on opposite sides of the module board;
wherein
the power amplifier, the first transmission filter, the second transmission filter and the first reception filter are disposed on the first principal surface,
the first switch and a control circuit are included in a first semiconductor integrated circuit,
the first semiconductor integrated circuit is stacked on the power amplifier,
the second switch, the third switch and the low noise amplifier are disposed on the second principal surface, and
the second switch and at least one of the third switch and the low noise amplifier are included in a second semiconductor integrated circuit.
2. The radio frequency module of claim 1, wherein the second switch and the third switch are included in the second semiconductor integrated circuit.
3. The radio frequency module of claim 2, wherein the second switch, the third switch and the low noise amplifier are included in the second semiconductor integrated circuit.
4. The radio frequency module of claim 2, wherein in a plan view of the module board, the power amplifier, the control circuit and the first switch do not overlap the second switch, the third switch and the low noise amplifier.
5. The radio frequency module of claim 2, further comprising:
a plurality of external-connection terminals disposed on the second principal surface.
6. The radio frequency module of claim 5, wherein the plurality of external-connection terminals include a plurality of ground terminals, and
in a plan view of the module board, at least one of the plurality of the ground terminals is disposed between the second switch and a stack structure including the power amplifier, the control circuit and the first switch.
7. The radio frequency module of claim 5, further comprising:
a heat-dissipating via conductor that extends from the first principal surface to the second principal surface and is connected to a ground electrode of the power amplifier, and
the heat-dissipating via conductor is connected to a first external-connection terminal of the plurality of exter- nal-connection terminals, the first external-connection terminal being connected to a ground.

8. The radio frequency module according to claim 7, further comprising:
an output transformer that includes a first coil and a second coil, wherein
the power amplifier includes a first amplifying element and a second amplifying element,
the power amplifier and the output transformer are included in a transmission amplifier circuit,
a first end of the first coil is connected to an output terminal of the first amplifying element,
a second end of the first coil is connected to an output terminal of the second amplifying element, and
a first end of the second coil is connected to an output terminal of the transmission amplifier circuit.

9. The radio frequency module of claim 8, wherein the output transformer is disposed on the first principal surface.

10. The radio frequency module of claim 9, wherein in a plan view of the module board, no circuit component is disposed in a region of the second principal surface that overlaps the output transformer.

11. The radio frequency module of claim 10, wherein the output transformer is disposed on the second principal surface.

12. The radio frequency module of claim 11, wherein in a plan view of the module board, no circuit component is disposed in a region of the first principal surface that overlaps the output transformer.

13. The radio frequency module of claim 8, wherein the output transformer is disposed between the first principal surface and the second principal surface.

14. The radio frequency module of claim 13, wherein in a plan view of the module board,
no circuit component is disposed in a region of the first principal surface that overlaps the output transformer, and
no circuit component is disposed in a region of the second principal surface that overlaps the output transformer.

15. The radio frequency module of claim 8, wherein the output transformer is disposed between the first principal surface and the second principal surface and closer to one of the first principal surface and the second principal surface than another of the first principal surface and the second principal surface.

16. The radio frequency module of claim 15, wherein in a plan view of the module board,
no circuit component is disposed in a region of the one of the first principal surface and the second principal surface that overlaps the output transformer, and
a circuit component is disposed in a region included in the another of the first principal surface and the second principal surface that overlaps the output transformer.

17. A radio frequency module, comprising:
a transmission input terminal;
an antenna connection terminal;
a first power amplifier;
a second power amplifier;
a first switch configured to switch a first connection between the transmission input terminal and the first power amplifier and a second connection between the transmission input terminal and the second power amplifier;
a first transmission filter;
a second transmission filter;
a second switch configured to switch a third connection between the first power amplifier and the first transmission filter and a fourth connection between the first power amplifier and the second transmission filter;
a first reception filter;
a low noise amplifier connected to the first reception filter;
a third switch configured to switch a fifth connection between the antenna connection terminal and the first transmission filter and a sixth connection between the antenna connection terminal and the second transmission filter and a seventh connection between the antenna connection terminal and the first reception filter; and
a module board that includes a first principal surface and a second principal surface on opposite sides of the module board;
wherein
the first power amplifier and the second power amplifier are included in a first semiconductor integrated circuit,
the first semiconductor integrated circuit, the first transmission filter, the second transmission filter and the first reception filter are disposed on the first principal surface,
the first switch and a control circuit are included in a second semiconductor integrated circuit,
the second semiconductor integrated circuit is stacked on the first semiconductor integrated circuit,
the second switch, the third switch and the low noise amplifier are disposed on the second principal surface, and
the second switch and at least one of the third switch and the low noise amplifier are included in a third semiconductor integrated circuit.

18. The radio frequency module of claim 17, wherein the second switch and the third switch are included in the third semiconductor integrated circuit.

19. The radio frequency module of claim 18, wherein the second switch, the third switch and the low noise amplifier are included in the third semiconductor integrated circuit.

20. The radio frequency module of claim 18, wherein in a plan view of the module board, the first power amplifier, the second power amplifier, the control circuit and the first switch do not overlap the second switch, the third switch and the low noise amplifier.

21. The radio frequency module of claim 18, further comprising:
a plurality of external-connection terminals disposed on the second principal surface.

22. The radio frequency module of claim 21, wherein the plurality of external-connection terminals include a plurality of ground terminals, and
in a plan view of the module board, at least one of the plurality of the ground terminals is disposed between the second switch and a stack structure including the first semiconductor integrated circuit and the second semiconductor integrated circuit.

* * * * *